United States Patent
Abe et al.

(10) Patent No.: US 6,832,359 B2
(45) Date of Patent: Dec. 14, 2004

(54) APPARATUS AND METHOD FOR CALCULATING SIMULATION COVERAGE

(75) Inventors: Kenji Abe, Kawasaki (JP); Hideki Isobe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/630,938

(22) Filed: Jul. 31, 2003

(65) Prior Publication Data

US 2004/0025124 A1 Feb. 5, 2004

(30) Foreign Application Priority Data

Aug. 2, 2002  (JP) ........................................ 2002-225523

(51) Int. Cl.$^7$ ............................................. G06F 17/50
(52) U.S. Cl. ............................................. 716/4; 703/13
(58) Field of Search ........................ 716/1, 4; 703/13, 703/14, 19

(56) References Cited

U.S. PATENT DOCUMENTS

| | | | | |
|---|---|---|---|---|
| 6,321,368 B1 | * | 11/2001 | Abe ................................ | 716/9 |
| 6,446,243 B1 | * | 9/2002 | Huang et al. .................... | 716/7 |
| 6,564,356 B1 | * | 5/2003 | Malik et al. .................... | 716/4 |
| 6,678,841 B1 | * | 1/2004 | Kurosawa et al. ............. | 714/57 |
| 6,697,961 B1 | * | 2/2004 | Petrenko et al. ............... | 714/26 |
| 6,698,012 B1 | * | 2/2004 | Kossatchev et al. ........ | 717/126 |
| 2002/0002698 A1 | * | 1/2002 | Hekmatpour ................... | 716/4 |
| 2003/0078878 A1 | * | 4/2003 | Opsahl-Ong ................. | 705/38 |
| 2004/0015910 A1 | * | 1/2004 | Tonouchi ..................... | 717/143 |

OTHER PUBLICATIONS

English Language Abstract of Japanese Unexamined Patent Publication No. 2001–014365 published Jan. 19, 2001.

* cited by examiner

*Primary Examiner*—Stacy A. Whitmore
(74) *Attorney, Agent, or Firm*—Staas & Halsey LLP

(57) ABSTRACT

A simulation coverage calculating apparatus is provided for calculating a simulation coverage for a complete verification. The apparatus includes a first input unit, a second input unit, an effective test pattern calculating unit, a coverage ratio calculating unit, and an output unit. The first input unit reads a property that represents effective test patterns to a logic circuit to be verified. The effective test pattern calculating unit calculates the effective test patterns based on the property. The second input unit reads the test patterns entered and executed by a verifier. The coverage ratio calculating unit calculates a coverage ratio from a ratio of the number of the test patterns matched to the effective test patterns to the number of all of the effective test patterns. The output unit outputs the calculated coverage ratio.

4 Claims, 10 Drawing Sheets

|  | t | | | t+1 | | |
| --- | --- | --- | --- | --- | --- | --- |
|  | P | Q | EN | P | Q | EN |
| PATTERN α | 1 | 1 | 0 | 0 | 0 | 0 |
| PATTERN β | 1 | 1 | 0 | 0 | 0 | 1 |
| PATTERN γ | 0 | 0 | 0 | 0 | 0 | 1 |
| PATTERN δ | 0 | 1 | 0 | 0 | 1 | 1 |
| PATTERN ε | 1 | 0 | 0 | 1 | 0 | 1 |

FIG.2

| | t | | | | t+1 | | | | t+2 | | | |
|---|---|---|---|---|---|---|---|---|---|---|---|---|
| | P | Q | R | S | P | Q | R | S | P | Q | R | S |
| PATTERN(1) | 0 | 0 | 0 | 0 | — | — | — | — | — | — | — | — |
| PATTERN(2) | 0 | 0 | 0 | 1 | — | — | — | — | — | — | — | — |
| PATTERN(3) | 0 | 0 | 1 | 0 | — | — | — | — | — | — | — | — |
| PATTERN(4) | 0 | 0 | 1 | 1 | — | — | — | — | — | — | — | — |
| PATTERN(5) | 0 | 1 | 0 | 0 | — | — | — | — | — | — | — | — |
| PATTERN(6) | 0 | 1 | 0 | 1 | — | — | — | — | — | — | — | — |
| PATTERN(7) | 0 | 1 | 1 | 0 | — | — | — | — | — | — | — | — |
| PATTERN(8) | 0 | 1 | 1 | 1 | — | — | — | — | — | — | — | — |
| PATTERN(9) | 1 | 0 | 0 | 0 | — | — | — | — | — | — | — | — |
| PATTERN(10) | 1 | 0 | 0 | 1 | — | — | — | — | — | — | — | — |
| PATTERN(11) | 1 | 0 | 1 | 0 | — | — | — | — | — | — | — | — |
| PATTERN(12) | 1 | 0 | 1 | 1 | — | — | — | — | — | — | — | — |
| PATTERN(13) | 1 | 1 | 0 | 0 | — | — | — | — | — | — | — | — |
| PATTERN(14) | 1 | 1 | 0 | 1 | — | — | — | — | — | — | — | — |
| PATTERN(15) | 1 | 1 | 1 | 0 | — | — | — | — | — | — | — | — |
| PATTERN(16) | 1 | 1 | 1 | 1 | — | — | — | — | — | — | — | — |

FIG.6A

| | t | | t+1 | | t+2 | |
|---|---|---|---|---|---|---|
| | EN1 | EN2 | EN1 | EN2 | EN1 | EN2 |
| PATTERN1 | — | — | 1 | 1 | — | — |

FIG.6B

| | t | | t+1 | | t+2 | |
|---|---|---|---|---|---|---|
| | OUT1 | OUT2 | OUT1 | OUT2 | OUT1 | OUT2 |
| PATTERN① | — | — | — | — | 0 | 1 |
| PATTERN② | — | — | — | — | 1 | 0 |
| PATTERN③ | — | — | — | — | 1 | 1 |

FIG.6C

```
A    always @(posedge CLK) begin
          if(P)
              a <=a1;          (1)
          else
              a <=a2;          (2)
     end B    always @(posedge CLK) begin
          if(Q)
              b <=b1;          (3)
          else
              b <=b2;          (4)
     end C    always @(posedge CLK) begin
          if(EN)
              OUT <=a & b;     (5)
          else
              OUT <=0;         (6)
     end
```

FIG.7
PRIOR ART

|  | t | | | t+1 | | |
|---|---|---|---|---|---|---|
|  | P | Q | EN | P | Q | EN |
| PATTERN(1) | 0 | 0 | — | — | — | 1 |
| PATTERN(2) | 0 | 1 | — | — | — | 1 |
| PATTERN(3) | 1 | 0 | — | — | — | 1 |
| PATTERN(4) | 1 | 1 | — | — | — | 1 |

FIG.9
PRIOR ART

|  | t | | | t+1 | | |
| --- | --- | --- | --- | --- | --- | --- |
|  | P | Q | EN | P | Q | EN |
| PATTERN α | 1 | 1 | 0 | 0 | 0 | 0 |
| PATTERN β | 1 | 1 | 0 | 0 | 0 | 1 |

**FIG.10
PRIOR ART**

APPARATUS AND METHOD FOR CALCULATING SIMULATION COVERAGE

CROSS-REFERENCE TO RELATED APPLICATIONS

This application is based upon and claims the benefit of priority from the prior Japanese Patent Application No. 2002-225523, filed on Aug. 2, 2002, the entire contents of which are incorporated herein by reference.

BACKGROUND OF THE INVENTION (1) Field of the Invention

The present invention relates to an apparatus and a method for calculating a simulation coverage, and more particularly to the apparatus and the method that are arranged to calculate a simulation coverage for a logic circuit through the use of a computer.

(2) Description of the Related Art

Today, the system LSI (Large Scale Integrated Circuit) has been made higher in function and greater in logical scale, so that the verification in designing such a system LSI may become longer and longer. For the design verification, as an index to a complete verification, a coverage is used.

The coverage is basically calculated on the basis of the number of lines executed by the design simulation, included in all lines described in a hardware description language (referred to as a HDL). This kind of coverage is called a line coverage.

However, the line coverage, that is, the conventional verifying method has no concept of time, concretely, no concept of when a certain line is executed. Hence, even though the line coverage ratio reaches 100%, disadvantageously, it does not necessarily mean the effective design verification.

Hereafter, this disadvantage will be concretely described.

FIG. 7 shows an exemplary description of a HDL.

Further, FIG. 8 is a circuit diagram showing a circuit designed in the HDL description shown in FIG. 7.

In FIG. 7 and FIG. 8, the block A described in the HDL corresponds to a circuit 50, the block B corresponds to a circuit 51, and the block C corresponds to a circuit 52, each of which circuits is composed of a flip-flop, for example.

Hereinafter, the description will be expanded along the case that the circuit shown in FIG. 8 is verified.

In FIG. 8, P, Q, EN, OUT, a, and b denote signal names, respectively.

Each of the blocks A, B and C includes a description of "always @(posedge CLK) begin" and is started on the rise of a clock signal (not shown). In the circuit 50 described in the block A, if P=1, a=a1 is outputted, while if not, a=a2 is outputted. In the circuit 51 described in the block B, if Q=1, b=b1 is outputted, while if not, b=b2 is outputted. Further, in the circuit 52 described in the block C, if EN=1, OUT=a&b is outputted, while if not, OUT=0 is outputted.

FIG. 9 shows test patterns that are effective in verifying the operation of the logic circuit shown in FIG. 8.

For the logic circuit shown in FIG. 8, four effective test patterns may be provided, that is, a pattern (1), a pattern (2), a pattern (3), and a pattern (4) as shown in FIG. 9, in which "-" indicates any value of 0 and 1.

Herein, the description will be oriented to the case that the following test patterns are entered by the user.

FIG. 10 shows an example of the test patterns entered by the user.

In a case that the user enters the patterns α and β for verifying the logic circuit shown in FIG. 8, the pattern α covers the lines (1) to (4) and (6) shown in FIG. 7, while the pattern β covers the lines (1) to (6) shown therein. It covers all lines. Although it means that only the pattern β is the effective one of the test patterns shown in FIG. 9, the resulting line coverage ratio reaches 100%. This is not the complete verification.

SUMMARY OF THE INVENTION

The present invention is made in consideration of the foregoing respect. It is an object of the present invention to provide a simulation coverage calculating apparatus that is arranged to calculate such a coverage as implementing a sufficient verification.

It is the other object of the present invention to provide a simulation coverage calculating method that is arranged to calculate such a coverage as implementing a sufficient verification.

In order to achieve the first object, the simulation coverage calculating apparatus is provided for calculating a simulation coverage for a logic circuit. The simulation coverage calculating apparatus includes a first input unit reading a property that represents one or more effective test patterns to the logic circuit to be verified; an effective test pattern calculating unit calculating one or more effective test patterns based on the property; a second input unit reading a test pattern entered and executed by a verifier; a coverage ratio calculating unit calculating a coverage ratio from the ratio of the number of the executed test patterns matched to the effective test patterns to the number of all the effective test patterns; and an output unit outputting the calculated coverage ratio.

In order to achieve the second object, the simulation coverage calculating method is provided for calculating a simulation coverage for a logic circuit through the use of a computer. The simulation coverage calculating method includes the steps of reading a property that represents one or more effective test patterns to the logic circuit to be verified; calculating the effective test patterns based on the property; reading one or more test patterns entered and executed by the verifier; and calculating a coverage ratio from a ratio of the number of the executed test patterns matched to the effective test patterns to the number of all the effective test patterns.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 2 is a table showing an example of test patterns entered by a user.

FIGS. 6A, 6B, and 6C are tables showing effective test patterns to the logic circuit shown in FIG. 5, in which FIG. 6A shows patterns of P, Q, R, and S, FIG. 6B shows patterns of EN1 and EN2, and FIG. 6C shows patterns of OUT1 and OUT2.

FIG. 7 is a view showing an exemplary description of a HDL.

FIG. 9 is a table showing test patterns that are effective in verifying the operation of the logic circuit shown in FIG. 8.

FIG. 10 is a table showing an example of test patterns entered by a user.

DESCRIPTION OF THE PREFERRED EMBODIMENTS

Hereafter, the embodiment of the present invention will be described with reference to the appended drawings.

Figure 1:
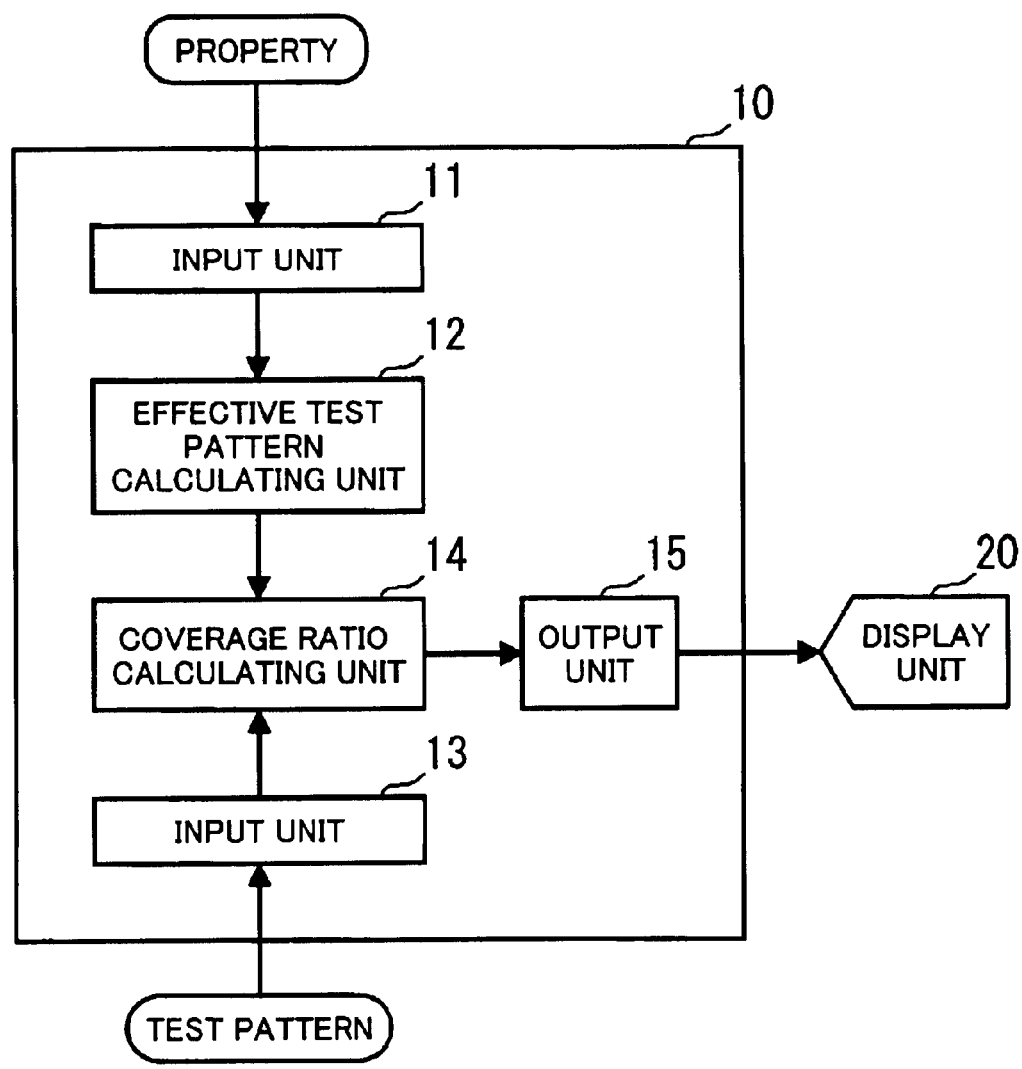
FIG. 1 is a function block diagram showing a simulation coverage calculating apparatus according to an embodiment of the present invention.

FIG. 1 is a function block diagram showing a simulation coverage calculating apparatus according to the embodiment of the invention.

A simulation coverage calculating apparatus 10 includes an input unit 11 of reading a property that represents effective test patterns to a logic circuit to be verified, an effective test pattern calculating unit 12 calculating the effective test patterns based on the property, an input unit 13 reading test patterns entered and executed by a verifier (called a user), a coverage ratio calculating unit 14 calculating a coverage ratio from a ratio of the number of the executed test patterns matched to the effective test patterns to the number of all the effective test patterns, and an output unit 15 outputting the calculated coverage ratio.

The input unit 11 reads a property which represents an effective test patterns to a logic circuit, and which is supplied by, for example, a designer of the logic circuit to be verified.

The effective test patterns are test patterns selected from all operation patterns of the logic circuit and the execution of only the selected test patterns results in reaching a complete verification. The details of the effective test pattern will be described later. Ordinarily, a person who designs the logic circuit knows this effective test pattern. However, it is hard for the third person, for example, the user who verifies the logic circuit, to know it. Hence, the designer, for example, supplies a representation of the effective test patterns as a property.

Figure 8:
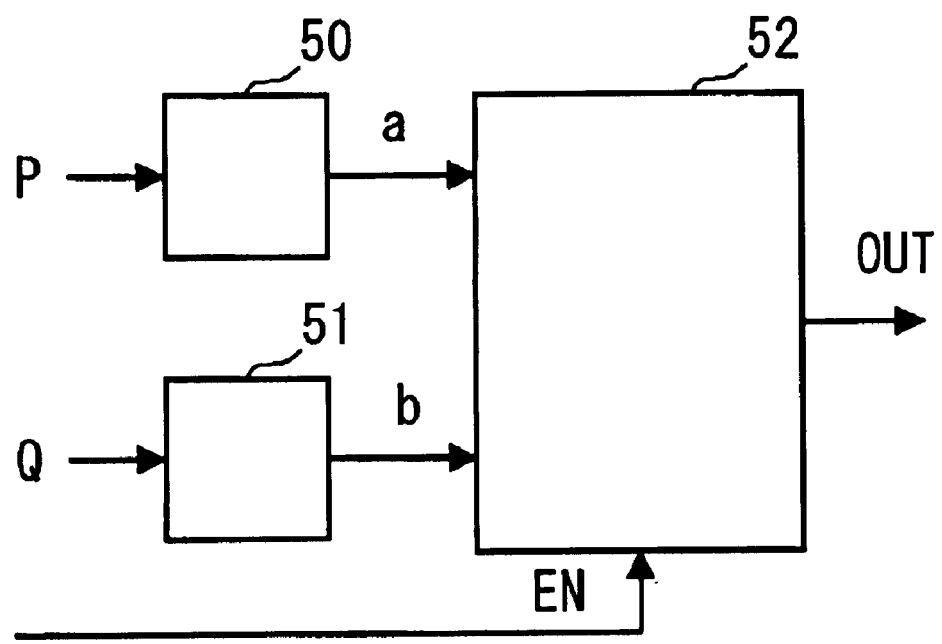
FIG. 8 is a circuit diagram showing a circuit designed in the HDL description shown in FIG. 7.

For the circuit shown in FIG. 8, as described above, the effective test patterns are those shown in FIG. 9. The supplier of the property represents the effective test patterns by means of an expression represented as follows.

$$[(P, Q)][EN==1] \qquad (1)$$

In this expression, (P, Q) means a combination of P and Q. EN==1 signifies that EN is 1. [ ] signifies that it is a delimiter of a cycle. That is, [(P, Q)] indicates a time t and [EN==1] indicates a time t+1. If a signal is not described in [ ], it may take any signal value.

The effective test pattern calculating unit 12 operates to calculate the effective test patterns to the logic circuit based on the property corresponding to the logic circuit to be logically simulated. The input unit 13 operates to read the test patterns entered and executed by the user who simulates the logic circuit. The coverage ratio calculating unit 14 operates to detect the degree of agreement between the effective test patterns calculated by the effective test pattern calculating unit 12 and the test patterns entered and executed by the user and then calculate a coverage ratio from a ratio of the number of the executed test patterns to the effective test patterns to the number of all the effective test patterns. The output unit 15 has a function of outputting the coverage ratio calculated by the coverage ratio calculating unit 14 to a display unit 20 or the like.

The description will be oriented to the operation of the simulation coverage calculating apparatus 10.

Hereafter, the circuit shown in FIG. 8 will be described along the case of calculating a coverage.

The property represented in the foregoing expression (1) that represents the effective test patterns to the logic circuit shown in FIG. 8, supplied by, for example, the property supplier such as a designer, is read into the input unit 11. Then, the effective test pattern calculating unit 12 operates to calculate the effective test patterns as shown in FIG. 9 based on the property.

On the other hand, in a case that the test patterns for simulating the logic circuit shown in FIG. 8, entered and executed by the user, are read into the input unit 13, those test patters are entered into the coverage ratio calculating unit 14 in which the coverage ratio is calculated. The calculation of the coverage ratio is executed by the process of detecting how many of the executed test patterns are matched to the effective test patterns shown in FIG. 9 and calculating a coverage ratio based on a ratio of the number of the executed test pattern(s) to the effective test patterns to the number of all the effective test patterns.

In a case that, for example, the test patterns shown in FIG. 10 are entered, the conventional line coverage reaches a coverage ratio of 100%. On the other hand, the simulation coverage calculating apparatus 10 according to this embodiment of the invention indicates a coverage ratio of 25% because only the pattern β corresponds to the effective test pattern (4).

The calculated result is outputted by the output unit 15 to the display unit 20.

The user finds out a lack of the effective test pattern as viewing the displayed result and adds new test patterns.

FIG. 2 shows an example of the test patterns to be entered by the user.

These test patterns are the addition of patterns γ, δ, and ε to the patterns α and β shown in FIG. 10. In this case, the pattern β corresponds to the effective test pattern (4) shown in FIG. 9, the pattern γ corresponds to the effective test pattern (1), the pattern δ corresponds to the effective test pattern (2), and the pattern ε corresponds to the effective test pattern (3). Hence, the coverage ratio calculating unit 14 operates to calculate a coverage ratio of 100%. The result is outputted by the output unit 15 to the display unit 20. The display unit 20 displays that the coverage ratio reaches 100% and thus the verification is complete.

In the simulation coverage calculating apparatus according to this embodiment, as described above, the effective test pattern calculating unit 12 calculates the effective test patterns to the logic circuit to be verified, based on the property that represents the effective test patterns to the logic circuit entered in the input unit 11 with the combination of signals and the time information. Then, the coverage ratio calculating unit 14 calculates a coverage ratio from a ratio of the number of the user's entered and executed test patterns matched to the effective test patterns to the number of all the effective test patterns. The simulation coverage calculating apparatus enables to execute a complete verification for the logic circuit.

Hereafter, the simulation coverage calculating method through the use of the simulation coverage calculating apparatus 10 will be described along the flowchart.

Figure 3:
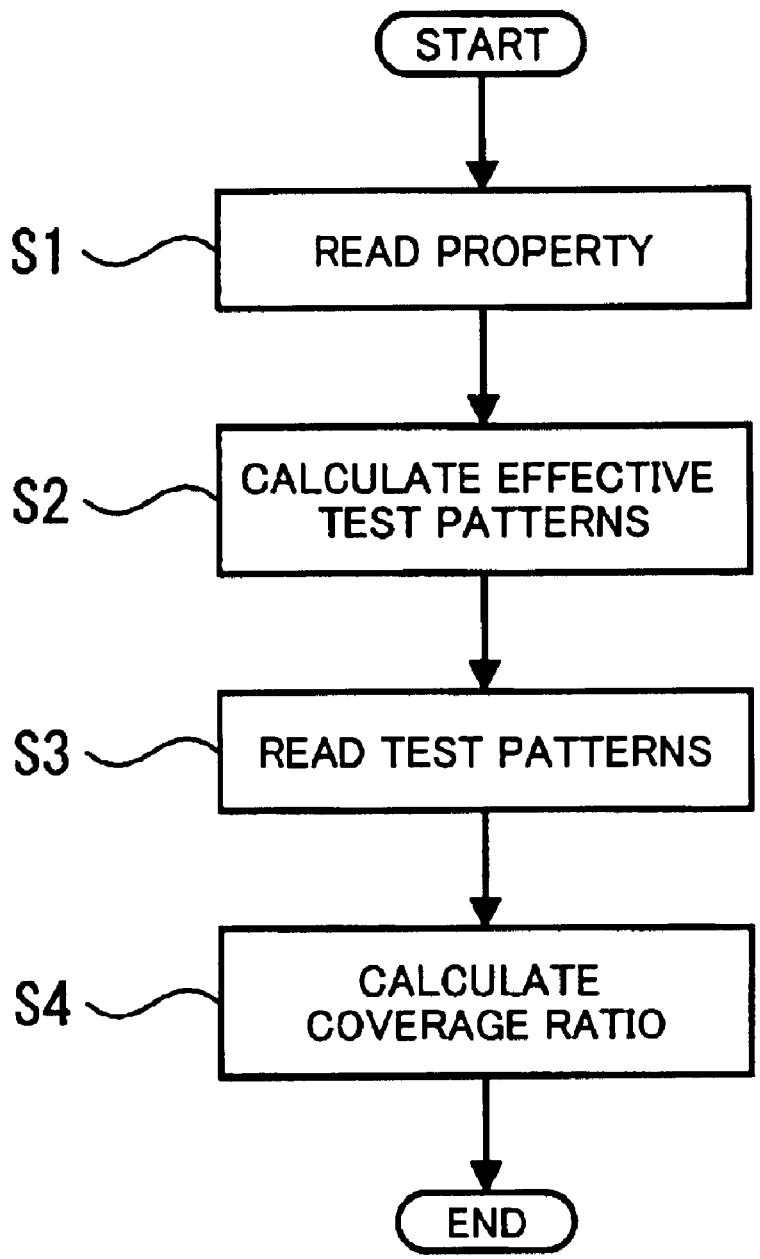
FIG. 3 is a flowchart showing a method for calculating a simulation coverage.

FIG. 3 is a flowchart showing the method for calculating a simulation coverage.

S1: Read a property.

The property that represents effective test patterns to a logic circuit to be verified is read into the input unit 11.

S2: Calculate effective test patterns.

Based on the read property, the effective test patterns are calculated by the effective test pattern calculating unit 12.

S3: Read test patterns.

The test patterns entered and executed by the user are read into the input unit 13.

S4: Calculate a coverage ratio.

The coverage ratio is calculated from the ratio of the number of the test patterns matched to the effective test patterns to the number of all the effective test patterns by the coverage ratio calculating unit 14.

As described above, the simulation coverage calculating method according to this embodiment takes the steps of entering a property that represents effective test patterns to the logic circuit with the combination of signals and the time information as indicated in the expression (1), calculating the effective test patterns of the logic circuit to be verified based on the property, and calculating a coverage ratio from a ratio of the number of the user's entered and executed test patterns matched to the effective test patterns to the number of all the effective test patterns. This method thus reaches the complete verification.

Hereafter, this embodiment of the present invention will be described in detail.

Figure 4:
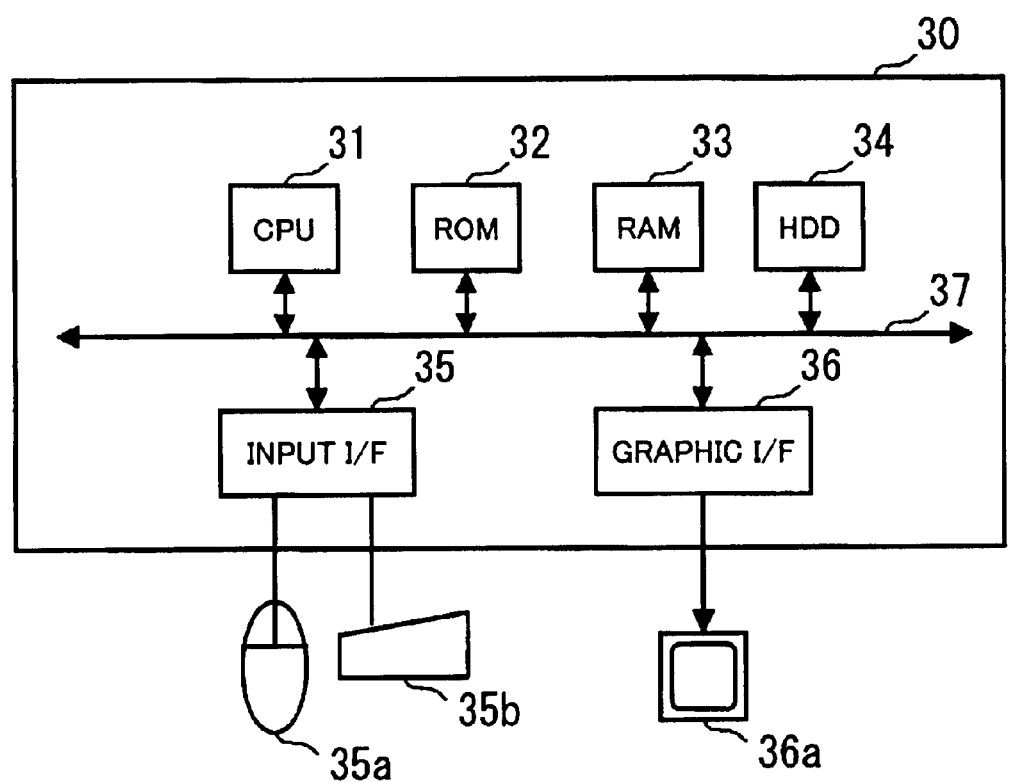
FIG. 4 is a diagram showing a hardware arrangement of the simulation coverage calculating apparatus.

FIG. 4 is a block diagram showing the hardware arrangement of the simulation coverage calculating apparatus.

The simulation coverage calculating apparatus may be a personal computer, for example. It is arranged to have a CPU (Central Processing Unit) 31 for controlling an overall apparatus, a group of memories such as a ROM (Read Only Memory) 32 and a RAM (Random Access Memory) 33, a HDD (Hard Disk Drive) 34, an input interface 35, and a graphic interface 36 connected through a bus 37.

The CPU 31 controls the overall apparatus and serves to execute programs stored in the HDD 34 or the ROM 32. It executes the processes that correspond with the effective test pattern calculating unit 12 and the coverage ratio calculating unit 14, respectively.

The ROM 32 stores a firmware or the like required for starting the HDD 34. The RAM 33 temporarily stores at least part of an OS (Operating System) program on which the CPU 31 is executed and application programs. The HDD 34 stores the OS, a program for simulating the logic circuit, a program for executing the simulation coverage calculating method of this invention, and the property that represents the effective test patterns to the logic circuit, supplied by the designer, for example.

The input interface 35 is connected with a mouse 35a and a keyboard 35b. This interface 35 transmits the signals sent from the mouse 35a and the keyboard 35b to the CPU 31 through the bus 37. It corresponds with the input units 11 and 13 of the simulation coverage calculating apparatus 10 shown in FIG. 1.

The graphic interface 36 is connected with a monitor 36a. The graphic interface 36 displays an image on the monitor 36a in accordance with the instructions from the CPU 31. It corresponds with the output unit 15 of FIG. 1.

Hereafter, the description will be oriented to the operation of the simulation coverage calculating apparatus 30.

Figure 5:
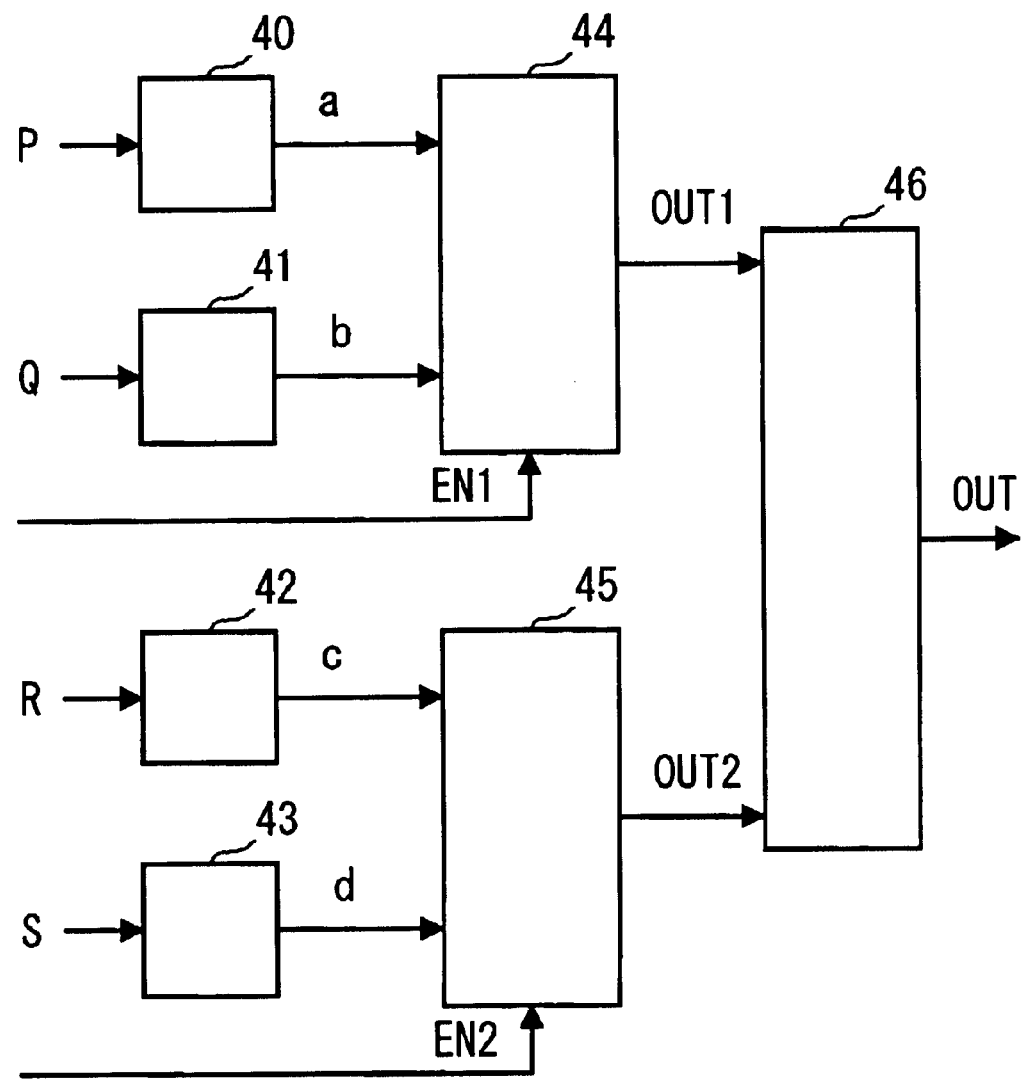
FIG. 5 is a block diagram showing an example of a logic circuit to be verified.

FIG. 5 shows an example of the logic circuit to be verified.

The logic circuit includes two logic circuits each of which is shown in FIG. 8. Each output OUT1 or OUT2 of these logic circuits is applied into the circuit 46.

Each of these circuits is composed of a flip-flop and the like.

In FIG. 5, P, Q, R, S, EN1, EN2, OUT1, OUT2, OUT, a, b, c, and d all denote signal names, respectively.

Though the HDL description is not described herein, the circuit 40 outputs a=a1 if P=1 or a=a2 if P=0. The circuit 41 outputs b=b1 if Q=1 or b=b2 if Q=0. The circuit 42 outputs c=c1 if R=1 or c=c2 if R=0. The circuit 43 outputs d=d1 if S=1 or d=d2 if S=0. The circuit 44 outputs OUT1=a & b if EN1=1 or OUT1=0 if EN1=0. The circuit 45 outputs OUT2=c & d if EN2=1 or OUT2=0 if EN2=0. The circuit 46 outputs OUT=OUT1 & OUT2. These circuits are inputted with clock signals (not shown) and are started on the rise of the clock signals.

FIG. 6 shows effective test patterns of the logic circuit shown in FIG. 5, in which FIG. 6A shows the patterns of P, Q, R and S, FIG. 6B shows the patterns of EN1 and EN2, and FIG. 6C shows the patterns of OUT1 and OUT2.

In FIG. 6, "-" denotes any value of 0 and 1.

Ordinarily, the effective test patterns as shown in FIG. 6 are arranged by the designer who designs the logic circuit. This is because the third person rather than the designer of the logic circuit has difficulty in grasping the middle signals except the input signals when verifying the logic circuit. For example, in the logic circuit shown in FIG. 5, assuming that P, Q, R, S, EN1, and EN2 are the input signals, the middle signals OUT1 and OUT2 cannot be normally grasped. Hence, it is quite difficult to create the effective test patterns of all the signals including the middle signals. On the other hand, the designer of the logic circuit has a full knowledge of the signals passing through the logic circuit. It is thus preferable for the designer to take the responsibility of creating the effective test patterns. Hereafter, therefore, the description will be expanded assuming that the effective test patterns are created by the designer of the logic circuit.

The designer creates a property based on the arranged effective test patterns.

For the effective test patterns shown in FIG. 6, the property is represented by the following expression.

$$[(P, Q, R, S)][EN1 \ \& \ EN2][OUT1|OUT2] \quad (2)$$

In this expression, the first [ ] signifies a time t, the next [ ] signifies a time t+1, and the last [ ] signifies a time t+2. [(P, Q, R, S)] indicates all combinations of P, Q, R and S, which are as shown in FIG. 6A. [EN1 & EN2] signifies a logical product (AND) of EN1 and EN2 and [OUT1 | OUT2] signifies a logical sum (OR) of OUT1 and OUT2, each of [EN1 & EN2] and [OUT1 | OUT2] representing the effective test patterns as shown in FIG. 6B and FIG. 6C. The signal that is not described in [ ] may take any signal value. The designer enters the expression (2) into the simulation coverage calculating apparatus 30 through the input interface 35 with, for example, the keyboard 35b or the mouse 35a. The entered property is inputted into and stored in the HDD 34 under the control of the CPU 31.

The property may be inputted on a recording medium such as a CD-ROM (Compact Disc Read Only Memory) or a DVD-ROM (DVD Read Only Memory) or the simulation coverage calculating apparatus 30 through a network like the internet.

In simulating the logic circuit, the user enters an instruction for indicating the start of the simulation with the mouse 35a or the keyboard 35b. The input interface 35 receives the instruction and then starts the logic circuit simulator stored in the HDD 34 under the control of the CPU 31. The started logic circuit simulator is processed by the graphic interface 36 under the control of the CPU 31 and then outputted to the monitor 36a. Further, for example, the logic circuit used for the simulation is displayed on the monitor 36a as shown in FIG. 5. The user enters some test patterns in this logic circuit with the mouse 35a and the keyboard 35b and then simulates the operation under the control of the CPU 31. The user checks the simulated result on the monitor 36a for verifying if a bug is found.

Further, the simulation coverage ratio is calculated by the following method.

In the case of verifying the logic circuit shown in FIG. 5, the property (that is, the expression 2) that represents the effective test patterns of the logic circuit shown in FIG. 5 is read from the HDD 34 under the control of the CPU 31. The effective test patterns to the logic circuit are calculated based on this property. Thus, the effective test patterns as shown in FIG. 6 are obtained. For example, these effective test patterns are temporarily stored in the RAM 33. The test patterns entered and executed by the user are compared with the effective test patterns under the control of the CPU 31. Then, the coverage ratio is calculated from a ratio of the test patterns matched to the effective test patterns.

More particularly, when the user enters a certain signal for test in the logic circuit, for example, the CPU 31 monitors at the states of the signals of various units including the middle signals the user cannot easily grasp and compares the test patterns of all signals including the middle signals with the effective test patterns, for calculating the coverage ratio.

The calculated coverage ratio is processed by the graphic interface 36 and then is outputted onto the monitor 36a. The user refers to the coverage ratio displayed on the monitor 36a. If the coverage ratio is low, the user adds further test patterns. If the test patterns entered by the user agree with the effective test patterns, the coverage ratio reaches 100%. This is the end of the verification.

As set forth above, the simulation coverage calculating method according to this embodiment is arranged to enter the property that represents the effective test patterns of the logic circuit to be verified with the combination of the signals and the time information as indicated in the expression 2 before simulating the logic circuit and to calculate the coverage ratio from a ratio of the number of the user's entered and executed test patterns matched to the effective test patterns to the number of all the effective test patterns calculated on the property. This makes it possible to execute the complete verification.

According to the present invention, the coverage ratio is calculated from the ratio of the number of the test patterns matched to the effective test patterns to the number of all the effective test patterns, based on the property that represents the effective test patterns to the logic circuit to be verified with the combination of the signals and the time information. The present invention thus realizes the complete verification.

The foregoing is considered as illustrative only of the principles of the present invention. Further, since numerous modifications and changes will readily occur to those skilled in the art, it is not considered to limit the invention to the exact construction and applications shown and described, and accordingly, all suitable modifications and equivalents may be regarded as falling within the scope of the invention in the appended claims and their equivalents.

What is claimed is:

1. A simulation coverage calculating apparatus for calculating a simulation coverage for a logic circuit, comprising:

a first input unit reading a property that represents one or more effective test patterns to the logic circuit to be verified;

an effective test pattern calculating unit calculating the effective test patterns based on the property;

a second input unit reading one or more test patterns entered and executed by a verifier;

a coverage ratio calculating unit calculating a coverage ratio from a ratio of the number of the test patterns matched to the effective test patterns to the number of all of the effective test patterns; and an output unit outputting the calculated coverage ratio.

2. The simulation coverage calculating apparatus according to claim 1, wherein the property represents the effective test patterns with the combinations of signals and the time information.

3. A simulation coverage calculating method for calculating a simulation coverage for a logic circuit through the use of a computer, comprising the steps of:

reading a property that represents one or more effective test patterns to the logic circuit to be verified;

calculating the effective test patterns based on the property;

reading one or more test patterns entered and executed by a verifier; and calculating a coverage ratio from a ratio of the number of the test patterns matched to the effective test patterns to the number of all of the effective test patterns.

4. The simulation coverage calculating method according to claim 3, wherein the property represents the effective test patterns with the combinations of signals and the time information.

* * * * *